United States Patent
Liang et al.

(10) Patent No.: US 9,875,991 B2
(45) Date of Patent: Jan. 23, 2018

(54) PACKAGE MODULE HAVING EXPOSED HEAT SINK

(71) Applicant: DELTA ELECTRONICS, INC., Taoyuan (TW)

(72) Inventors: Le Liang, Taoyuan (TW); Shou-Yu Hong, Taoyuan (TW); Zhen-Qing Zhao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/071,215

(22) Filed: Mar. 16, 2016

(65) Prior Publication Data
US 2016/0358837 A1    Dec. 8, 2016

(30) Foreign Application Priority Data
Jun. 5, 2015    (CN) .......................... 2015 1 0307039

(51) Int. Cl.
| | | |
|---|---|---|
| *H01L 25/065* | (2006.01) | |
| *H01L 21/56* | (2006.01) | |
| *H01L 23/433* | (2006.01) | |
| *H01L 23/495* | (2006.01) | |
| *H01L 23/31* | (2006.01) | |

(52) U.S. Cl.
CPC ........ *H01L 25/0655* (2013.01); *H01L 21/565* (2013.01); *H01L 23/4334* (2013.01); *H01L 23/49531* (2013.01); *H01L 23/49575* (2013.01); *H01L 25/0657* (2013.01); *H01L 23/3121* (2013.01); *H01L 23/49555* (2013.01)

(58) Field of Classification Search
CPC .............. H01L 25/0655; H01L 21/565; H01L 23/4334; H01L 23/49531; H01L 23/49575; H01L 23/3677; H01L 25/0657; H01L 23/3672
See application file for complete search history.

(56) References Cited

U.S. PATENT DOCUMENTS

| | | | | |
|---|---|---|---|---|
| 5,108,955 A | * | 4/1992 | Ishida | ................. H01L 21/565 249/95 |
| 5,326,240 A | * | 7/1994 | Kudo | ................. B29C 45/263 264/106 |
| 5,441,684 A | * | 8/1995 | Lee | ................. B29C 45/14655 257/E21.504 |
| 6,001,672 A | * | 12/1999 | Wensel | ................. H01L 21/565 257/E21.504 |

(Continued)

FOREIGN PATENT DOCUMENTS

| | | |
|---|---|---|
| CN | 1748306 A | 3/2006 |
| CN | 101752326 A | 6/2010 |

(Continued)

*Primary Examiner* — Alonzo Chambliss
(74) *Attorney, Agent, or Firm* — CKC & Partners Co., Ltd.

(57) ABSTRACT

A package module includes a power module, a first thermal dissipating component and a packaging plastic. The power module includes a substrate and at least one power semiconductor component disposed on the substrate. The first thermal dissipating component is disposed over the power module. The packaging plastic covers the power module and the first thermal dissipating component, wherein a portion of the first thermal dissipating component is exposed from the packaging plastic.

17 Claims, 12 Drawing Sheets

(56) References Cited

U.S. PATENT DOCUMENTS

| | | | | |
|---|---|---|---|---|
| 7,772,709 | B2* | 8/2010 | Ueda | H01L 21/565 |
| | | | | 257/787 |
| 9,437,517 | B2* | 9/2016 | Ochi | H01L 23/4334 |
| 2002/0195701 | A1* | 12/2002 | Bemmerl | H01L 21/563 |
| | | | | 257/706 |
| 2004/0012099 | A1* | 1/2004 | Nakayama | H01L 21/568 |
| | | | | 257/787 |
| 2007/0080437 | A1* | 4/2007 | Marimuthu | H01L 21/561 |
| | | | | 257/676 |
| 2007/0296076 | A1* | 12/2007 | Koike | H01L 21/565 |
| | | | | 257/706 |
| 2012/0098115 | A1* | 4/2012 | Watanabe | B29C 45/14655 |
| | | | | 257/690 |
| 2014/0183711 | A1* | 7/2014 | Soller | H01L 24/97 |
| | | | | 257/666 |
| 2014/0264790 | A1* | 9/2014 | Ewe | H01L 24/19 |
| | | | | 257/666 |
| 2015/0014840 | A1* | 1/2015 | Watanabe | H01L 23/3677 |
| | | | | 257/706 |

FOREIGN PATENT DOCUMENTS

| | | |
|---|---|---|
| TW | 200830490 A | 7/2008 |
| TW | 200947664 A | 11/2009 |
| TW | 201436128 A | 9/2014 |
| TW | 201508875 A | 3/2015 |

\* cited by examiner

PACKAGE MODULE HAVING EXPOSED HEAT SINK

RELATED APPLICATIONS

This application claims priority to China Application Serial Number 201510307039.2, filed Jun. 5, 2015, which is herein incorporated by reference.

BACKGROUND

Field of Disclosure

The present disclosure relates to a package module, a package module stacking structure, and the fabricating methods thereof.

Description of Related Art

High efficiency, high density and high reliability are trends of developments of the electronic devices for reducing power consumption, costs, and extending the service life of electronic device. Take a power converter as example, it include a power module, a drive board, thermal dissipating components (such as fins) and many peripheral electronic components.

However, since these thermal dissipating components are mostly adhered on the power module through a thermal conductive paste or gel, therefore, in addition to an additional paste attach process, defects such as delamination, voids and impurities easily occur in the process of adhering the thermal dissipating components. Furthermore, stress concentration problems may appear due to the different thermal expansion coefficients between the thermal conductive gel or paste and the packaging plastic.

SUMMARY

The disclosure provides a package module, a package module stacking structure and the fabricating methods thereof, by omitting the usage of the thermal conductive gel or paste; the present disclosure can avoid the problems due to the process of using thermal conductive gel or paste, and due to different thermal expansion coefficients between the thermal conductive gel or paste and the packaging plastic.

According to an aspect of the present disclosure, a package module is provided. The package module includes a power module, a first thermal dissipating component, and a packaging plastic. The power module includes a substrate and at least one power semiconductor component disposed on the substrate. The first thermal dissipating component is disposed on the power module. The packaging plastic covers the power module and the first thermal dissipating component, in which a portion of the first thermal dissipating component is exposed from the packaging plastic.

According to an aspect of the present disclosure, a package module stacking structure is provided. The package module stacking structure includes a first package module, a second package module, and a junction layer connecting the first package module and the second package module. Each of the first package module and the second package module includes a power module, a first thermal dissipating component, and a packaging plastic used for covering the power module and the first thermal dissipating component, wherein the power module includes a substrate, and at least a power semiconductor component disposed on the substrate, wherein a portion of the first thermal dissipating component is exposed from the packaging plastic.

According to an aspect of the present disclosure, a fabricating method of a package module is provided. The fabricating method includes disposing a power module in a cavity of a mold; disposing a first thermal dissipating component in the cavity, wherein the first thermal dissipating component is fixed to a top of the cavity; and injecting a packaging plastic into the cavity, to make the packaging plastic cover the power module and the first thermal dissipating component.

According to another aspect of the present disclosure, a fabricating method of a package module is provided. The fabricating method includes disposing at least a power semiconductor component on a substrate sequentially, to form a plurality of power modules; disposing the power modules in a cavity of a mold; disposing a first thermal dissipating component in the cavity, wherein the first thermal dissipating component is fixed to a top of the cavity; injecting a packaging plastic in the cavity, to make the packaging plastic covers the power modules and the first thermal dissipating component to form a package; getting the package from the mold; and cutting the package, for getting the plurality of package modules.

According to further another aspect of the present disclosure, a fabricating method of a package module stacking structure is provided. The fabricating method includes disposing a power module in a cavity of a mold; disposing a first thermal dissipating component in the cavity, wherein the first thermal dissipating component is fixed to the top of the cavity; injecting a packaging plastic in the cavity, to make the packaging plastic covers the power module and the first thermal dissipating component, to get a package module; and bonding two of the package modules, to get a package module stacking structure.

The package module of the present disclosure directly uses the packaging plastic to connect the power module and the thermal dissipating component, by omitting the usage of the thermal conductive gel or paste, the present disclosure can avoid the problems due to the different thermal expansion coefficients between the thermal conductive gel or paste and the packaging plastic and due to the process of using thermal conductive gel or paste.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
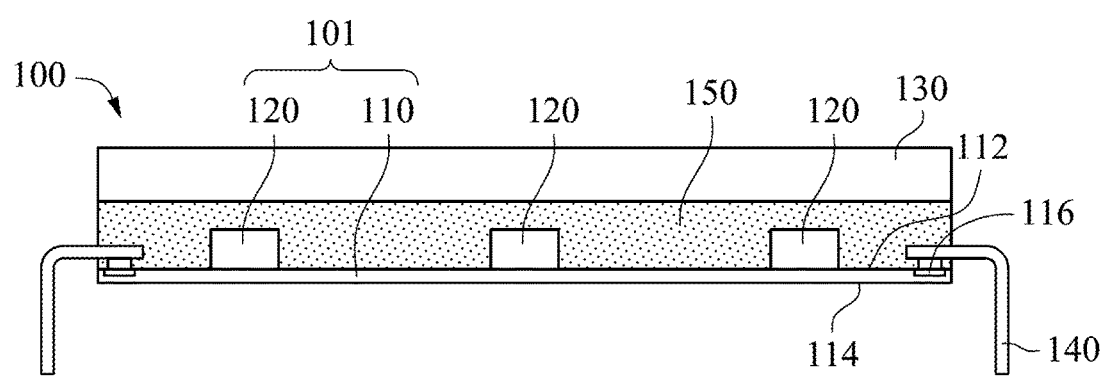
FIG. 1 is a cross-sectional view of a package module according to a first exemplary embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

For solving the problems due to the different thermal expansion coefficients between the thermal conductive gel or paste and the packaging plastic and reducing thermal resistance from package to thermal dissipating components, the package module of the present disclosure do not use the thermal conductive gel or paste to connect the thermal dissipating component and the package module of the power module, but uses the packaging plastic to directly connect the power module and the thermal dissipating component.

FIG. 1 is a cross-sectional view of a package module according to a first exemplary embodiment of the present disclosure. The package module 100 includes a power module 101, a first thermal dissipating component 130 and a packaging plastic 150. The power module 101 includes a substrate 110, and a power semiconductor component 120 disposed over the substrate 110. The substrate 110 can be a printed circuit board with a single layer or multi layers. The substrate 110 has an upper surface 112 and an opposite lower surface 114. A plurality of pads 116 are disposed on the upper surface 112 of the substrate 110.

The power semiconductor component 120 is disposed on the substrate 110. The power semiconductor component 120 can be a Surface-Mount Technology (SMT) component or a bare die which can produce thermal energy; such as a Metal-Oxide-Semiconductor Field-Effect Transistor (MOSFET), a diode, an Insulated Gate Bipolar Transistor (IGBT), a SiC diode, a SiC MOSFET, or a GaN MOSFET. The first thermal dissipating component 130 is disposed over the power semiconductor component 120, and the first thermal dissipating component 130 can directly contact or not directly contact the upper surface of the power semiconductor component 120, when there are a plurality of power semiconductor components 120, the first thermal dissipating component 130 can contact one or all of the power semiconductor components 120.

The package module 100 includes a plurality of pins 140. The pins 140 can be L-shaped pins. The pins 140 extend downwards on the side of the substrate 110. A terminal of each of the pins 140 connects to a pad 116 on the upper surface 112 of the substrate 110, to allow the electrically connect between the package module 100 and the external circuits. The packaging plastic 150 covers the power module 101 and the first thermal dissipating component 130, and a portion of the first thermal dissipating component 130 and a portion of the pins 140 are exposed of the packaging plastic 150. In this exemplary embodiment, the upper surface of the first thermal dissipating component 130 and a portion of the pins 140 are exposed of the packaging plastic 150.

In the package process, the first thermal dissipating component 130 is directly fixed by the packaging plastic 150, in this way, the usage of the conventional thermal conductive gel or paste can be omitted, thereby solving the defects such as delamination, voids, impurities due to the conventional thermal conductive gel or paste, and improving thermal conductivity, in addition, the stress concentration problems due to the different thermal expansion coefficients between the thermal conductive gel or paste and the packaging plastic can be avoided.

Figure 2A:
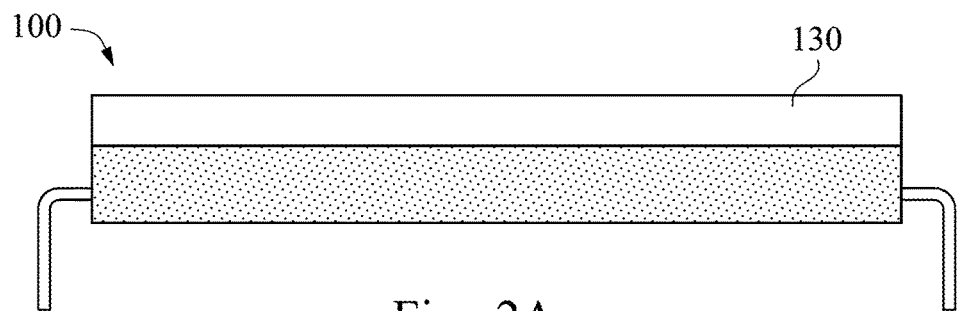
FIG. 2A to FIG. 2D are side views corresponding to different exemplary embodiments of the package module of the present disclosure.
Figure 2B:
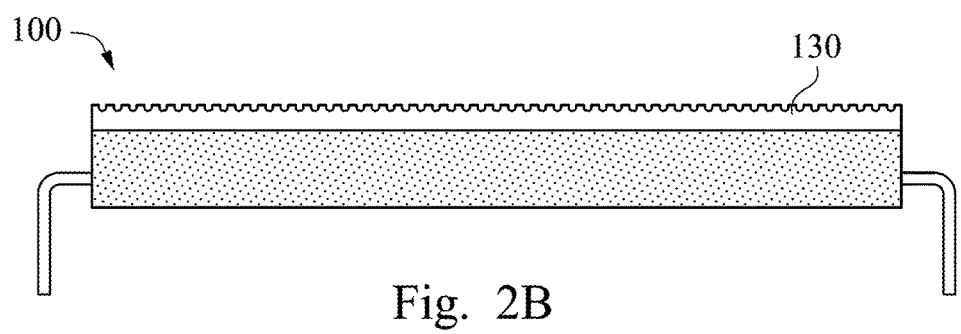
Figure 2C:
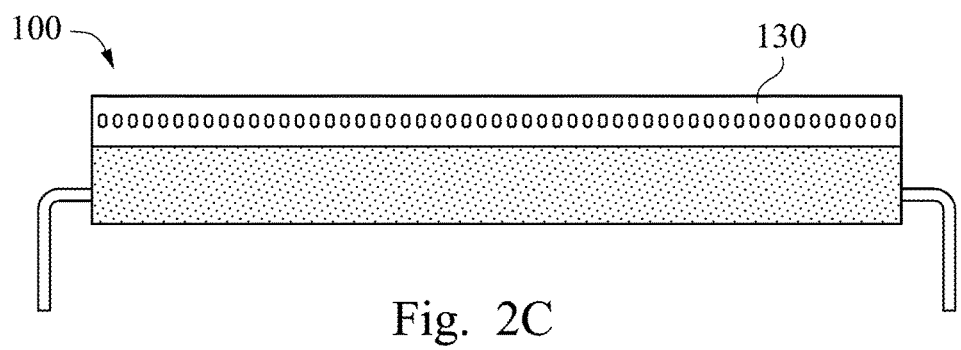
Figure 2D:
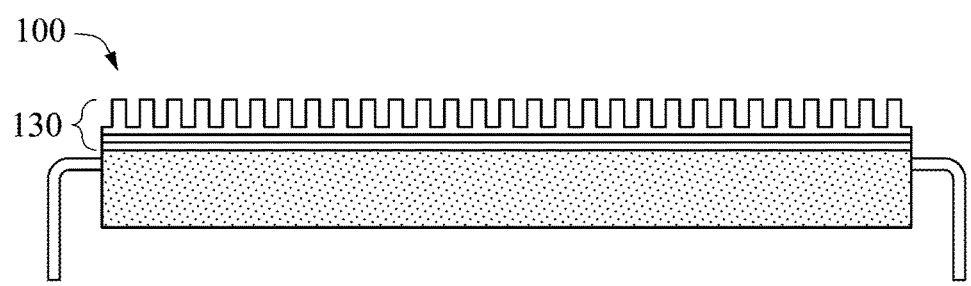

Please refer to FIG. 2A to FIG. 2D; FIG. 2A to FIG. 2D are side views corresponding to different exemplary embodiments of the package module of the present disclosure. The first thermal dissipating component 130 can have different types. The first thermal dissipating component 130 can be a heat sink, as shown in FIG. 2A, which can include a ceramic plate or a metal plate; the first thermal dissipating component 130 can be a set of fins, as shown in FIG. 2B; the first thermal dissipating component 130 can be a heat sink with a plurality of holes, as shown in FIG. 2C; or the first thermal dissipating component 130 can be a combination of the heat sink and a set of fins, as shown in FIG. 2D, in which the heat sink and the set of fins can be fixed via the solder. People in this art can choose thermal dissipating components according to different design requirements, the descriptions disclosed in the aforementioned embodiments are not meant to limit the present disclosure.

Figure 3:
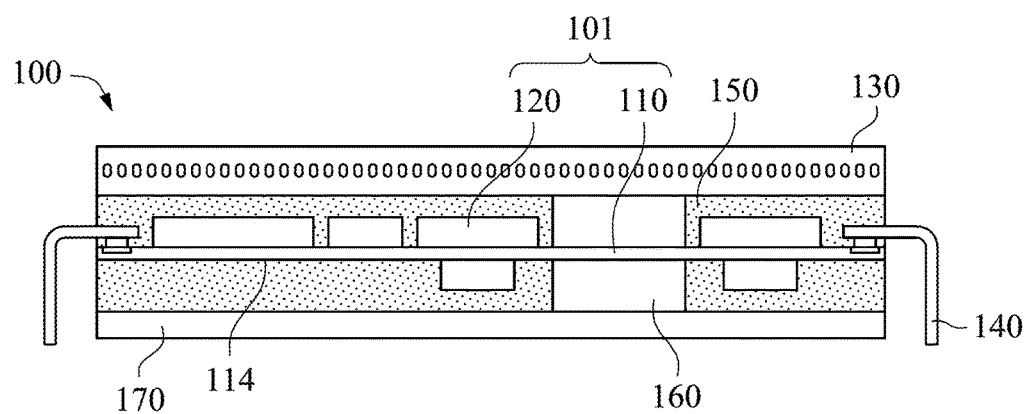
FIG. 3 is a cross-sectional view of a package module according to a second exemplary embodiment of the present disclosure.

Please refer to FIG. 3; FIG. 3 is a cross-sectional view of a package module according to a second exemplary embodiment of the present disclosure. The difference between the second exemplary embodiment and the first exemplary embodiment is that the package module 100 in the second exemplary embodiment further includes an electronic component 160 and a second thermal dissipating component 170. The electronic component 160 is disposed on the lower surface 114 of the substrate 110 or on the upper surface 112 of the substrate 110. The second thermal dissipating component 170 can directly contact the lower surface of the electronic component 160 or not. The packaging plastic 150 covers the power module 101, the first thermal dissipating component 130, and the second thermal dissipating component 170, in which a portion of the first thermal dissipating component 130, a portion of the second thermal dissipating component 170 and a portion of the pins 140 are exposed from the packaging plastic 150. In this exemplary embodiment, the upper surface of the first thermal dissipating component 130, the lower surface of the second thermal dissipating component 170, and a portion of the pins 140 are exposed from the packaging plastic 150.

The electronic component 160 can be a SMT component, such as a control chip, a passive component, or a magnetic component. Similarly, if there are a plurality of electronic components 160, the second thermal dissipating component 170 can contact one or all of the electronic components 160. The types of the first thermal dissipating component 130 and the second thermal dissipating component 170 can be a heat sink, a set of fins, a heat sink with a plurality of holes, or the combination of the heat sink and a set of fins.

The second thermal dissipating component 170 in this exemplary embodiment also fix in the package module 100 through the packaging plastic 150, by omitting the usage of the conventional thermal conductive gel or paste, the aforementioned problems due to the convention usage of the thermal conductive gel or paste are avoided.

Figure 4:
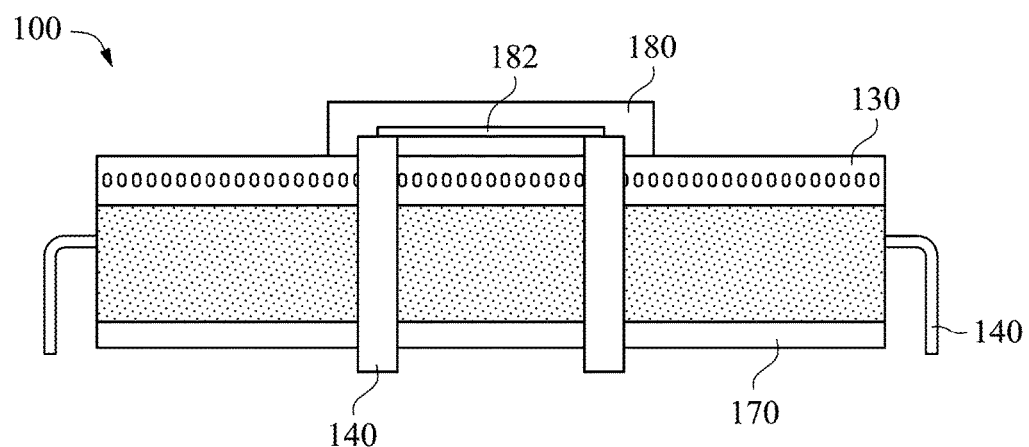
FIG. 4 is a cross-sectional view of a package module according to a third exemplary embodiment of the present disclosure.

Please refer to FIG. 4; FIG. 4 is a cross-sectional view of a package module according to a third exemplary embodiment of the present disclosure. The difference between this exemplary embodiment and the second exemplary embodiment is that the package module 100 here further includes a passive component 180. The passive component 180 can be an electronic component which has been packaged, such as an inductor, a capacitor, or a transformer. The passive component 180 can be disposed on the upper surface of the first thermal dissipating component 130, or on the lower surface of the second thermal dissipating component 170, or on the upper surface of the first thermal dissipating component 130 and on the lower surface of the second thermal dissipating component 170 by the solder or by the packaging plastic. The passive component 180 includes exposed side-pad 182, a portion of the pins 140 connects to the side-pad 182, to make the passive component 180 electrically connect to the external circuits. In this exemplary embodiment, the pins 140 of the passive component 180 are revealed, for electrically connecting to the external circuits.

Figure 5:
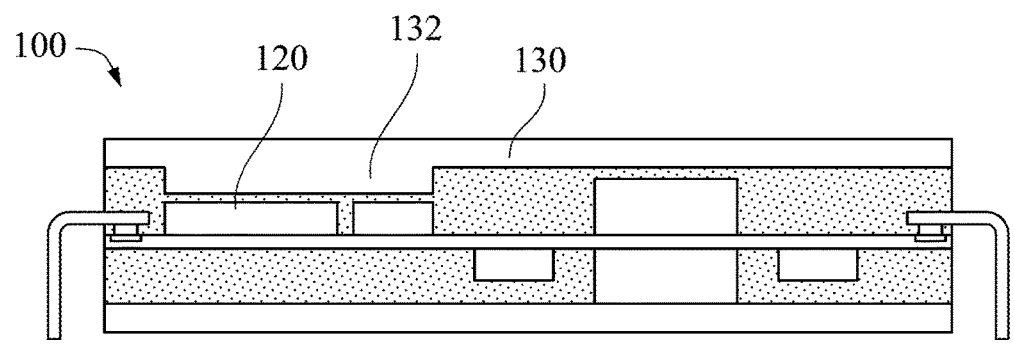
FIG. 5 is a cross-sectional view of a package module according to a fourth exemplary embodiment of the present disclosure.

Please refer to FIG. 5; FIG. 5 is a cross-sectional view of a package module according to a fourth exemplary embodiment of the present disclosure. The difference between this exemplary embodiment and the first exemplary embodiment is that the first thermal dissipating component 130 in this exemplary embodiment is a heat sink, the first thermal dissipating component 130 includes a lug 132 disposed above the power semiconductor component 120 and is embedded in the packaging plastic 150. In other words, when there are a plurality of power semiconductor components 120, the power semiconductor components 120 can respectively have different thicknesses, by disposing the power semiconductor components 120 under the lug 132, the distance between the first thermal dissipating component 130 and the power semiconductor components 120 can be shortened, thereby promoting the thermal dissipating ability of the first thermal dissipating component 130. In this exemplary embodiment, the lug 132 should be placed as close as possible to the power semiconductor components 120, or the lug 132 can directly contact the power semiconductor components 120.

Figure 6:
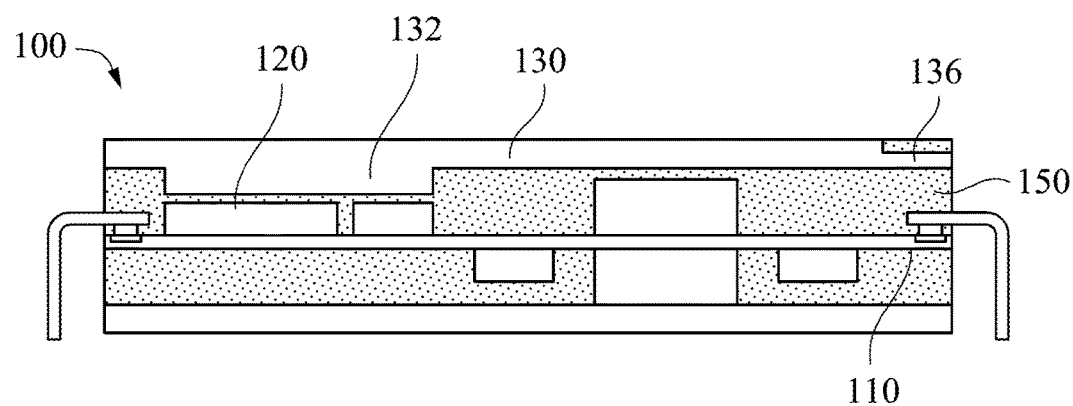
FIG. 6 is a cross-sectional view of a package module according to a fifth exemplary embodiment of the present disclosure.

Please refer to FIG. 6; FIG. 6 is a cross-sectional view of a package module according to a fifth exemplary embodiment of the present disclosure. The difference between this exemplary embodiment and the fourth exemplary embodiment is that first thermal dissipating component 130 in this exemplary embodiment further includes a flange 136, the flange 136 is located at the fringe of the first thermal dissipating component 130, and is with a thinner thickness. When the packaging plastic 150 covers the substrate 110 and the power semiconductor component 120, the flange 136 would be embedded within the packaging plastic 150 rather than be exposed of the packaging plastic 150. The bonding strength between the first thermal dissipating component 130 and the packaging plastic 150 can be enhanced by adding the flange 136, such that situation of the first thermal dissipating component 130 being separated from the packaging plastic 150 when subjected to an external force can be prevented.

It should be noted that, although in the descriptions of FIG. 4 to FIG. 6 the first thermal dissipating component 130 is used to be explain; however, it is not a limitation of the present disclosure, people skilled in this art can also design the second thermal dissipating component 170 as shown in FIG. 3 according to different design requirements by applying the aforementioned design embodiments. In summary, the package module 100 uses the packaging plastic 150 to fix the first thermal dissipating component 130 and the second thermal dissipating component 170 at the upper side and lower side of the power module 101. Therefore, the usage of the thermal conductive gel or paste can be omitted, thereby avoiding the conventional problems in the manufacturing process due to the thermal conductive gel or paste. The following exemplary embodiments will disclose the fabricating method of the package module 100.

Figure 7:
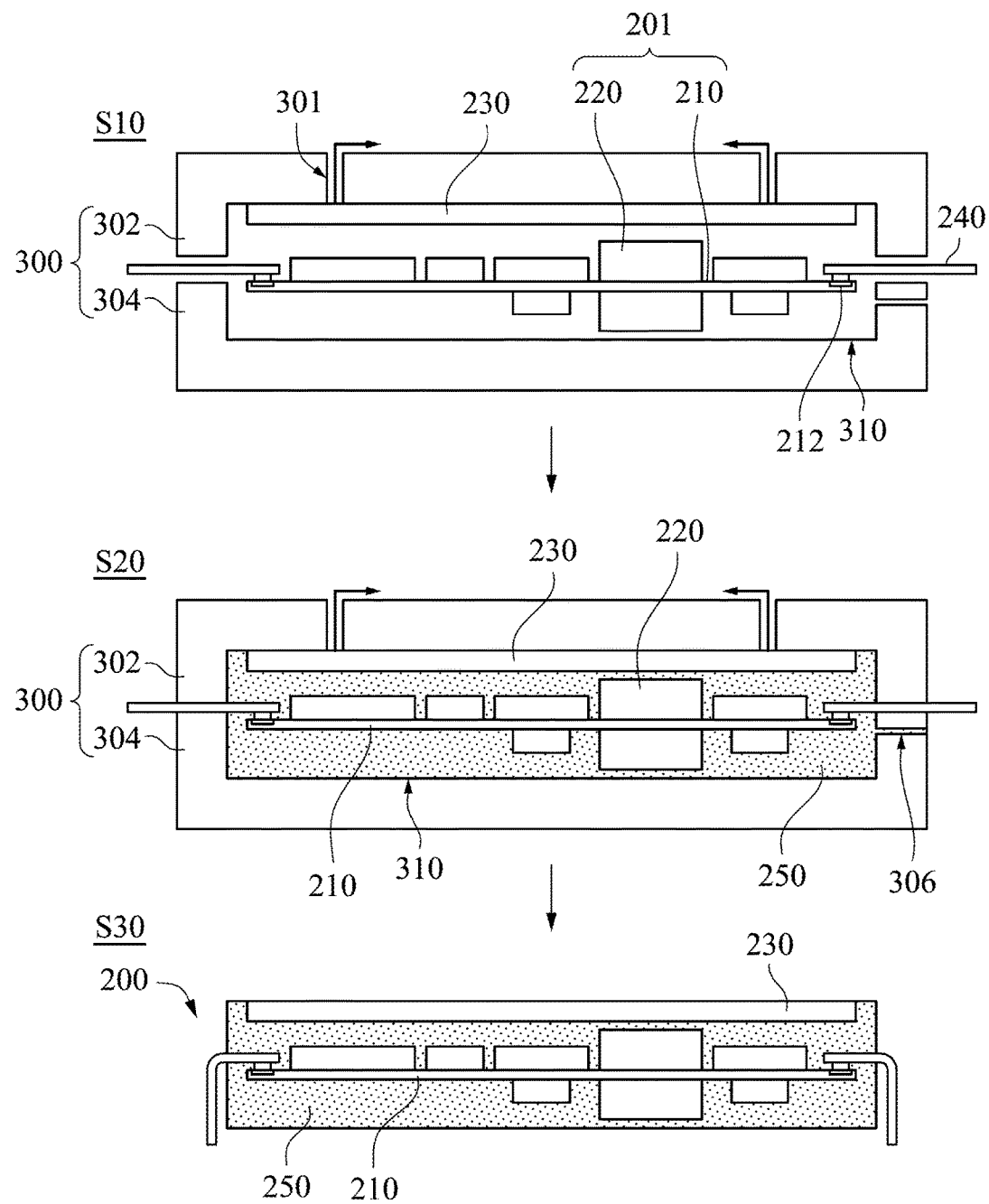
FIG. 7 is a first exemplary embodiment of a fabricating method of a package module in the present disclosure.

Please refer to FIG. 7; FIG. 7 is a flow chart of a first exemplary embodiment of a fabricating method of a package module in the present disclosure. In step S10, a power module 201 is disposed in a cavity 310 of a mold 300. The mold 300 includes an upper mold 302 and a lower mold 304, and the cavity 310 is defined between the upper mold 302 and the lower mold 304. The power module 201 includes a substrate 210, and at least one power semiconductor components 220 disposed on the substrate 210, the power semiconductor components 220 can be disposed on the upper surface of the substrate 210. A plurality of pads 212 are arranged on the substrate 210, such as on the upper surface of the substrate 210. A plurality of pins 240 respectively connect to the pads 212. In this step, the pins 240 are not bent yet, and the pins 240 are sandwiched between the upper mold 302 and the lower mold 304, for thereby positioning the substrate 210.

Step S10 further includes placing a first thermal dissipating component 230 in the cavity 310, in which the first thermal dissipating component 230 is fixed to a top of the cavity 310, and is located above the power module 201. When the upper mold 302 is combined with the lower mold 304, the first thermal dissipating component 230 can be allowed to contact or not contact the power semiconductor components 220.

In this exemplary embodiment, the first thermal dissipating component 230 is fixed to the top of the cavity 310 in a vacuum suction manner. Specifically, the upper mold 302 has a plurality of channels 301, which are led to the top of the upper mold 302. The channels 301 communicate with the cavity 310, and the channels 301 further connect to a negative pressure source. Thus the first thermal dissipating component 230 is fixed at the top of the upper mold 302 by the suction of the negative pressure source.

Next, in step S20, the upper mold 302 and lower mold 304 are coupled, and a packaging plastic 250 is injected in the cavity 310. The packaging plastic 250 covers the power module 201 and the first thermal dissipating component 230. More specifically, the upper mold 302 and/or the lower mold 304 have packaging plastic injection port 306, and the packaging plastic 250 are injected to the cavity 310 through the packaging plastic injection port 306 thereby filling the cavity 310 and the space between the first thermal dissipating component 230 and the power module 201. The packaging plastic 250 connects the first thermal dissipating component 230 and the power module 201, and the power module 201 is combined with the first thermal dissipating component 230 by the packaging plastic 250.

Finally, in step S30, after the packaging plastic 250 is solidified, the package module 200 is got from the mold. The excessive packaging plastic 250 is removed, and the pins 240 can be bent. This step may include remove the packaging plastic at the upper surface of the first thermal dissipating component 230, so that the upper surface of the first thermal dissipating component 230 is exposed from the packaging plastic 250.

Figure 8:
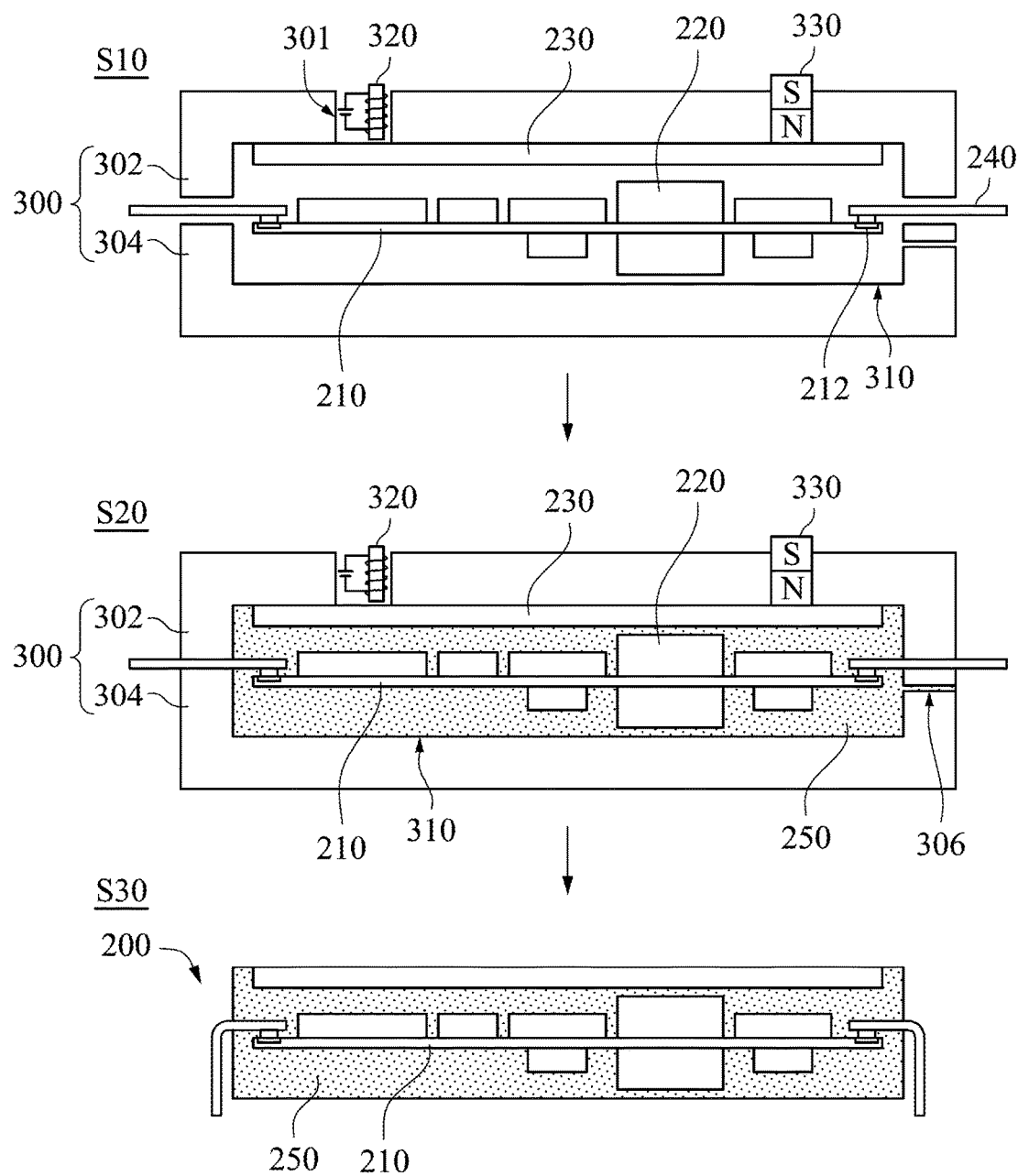
FIG. 8 is a flow chart of a second exemplary embodiment of a fabricating method of a package module in the present disclosure.

Please refer to FIG. 8; FIG. 8 is a flow chart of a second exemplary embodiment of a fabricating method of a package module in the present disclosure. The difference between this exemplary embodiment and the first exemplary embodiment is that Step S10 herein uses a magnetic suction manner to fix the first thermal dissipating component 230 to the top of the cavity 310.

In this exemplary embodiment, the material of the first thermal dissipating component 230 is metal with high thermal conductivity and can be absorbed by the magnetic force. The mold 300 further includes an electromagnet 320 and/or a permanent magnet 330, the electromagnet 320 and/or the permanent magnet 330 are disposed in the channels 301, for fixing the first thermal dissipating component 230 to the top of the cavity 310 by using the magnetic force to fasten the first thermal dissipating component 230, thereby avoiding displacement during the packaging plastic injection.

Figure 9:
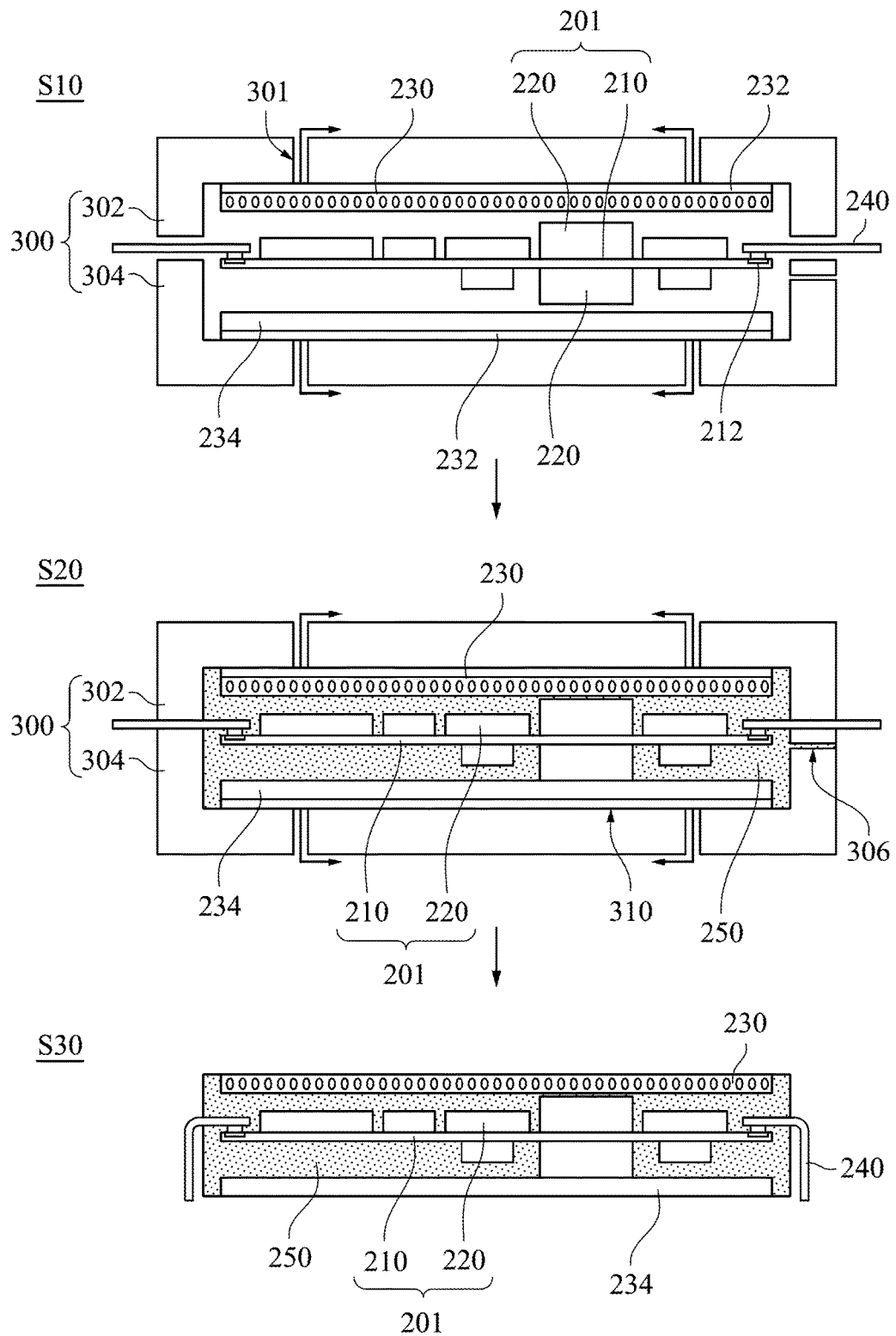
FIG. 9 is a flow chart of a third exemplary embodiment of a fabricating method of a package module in the present disclosure.

Please refer to FIG. 9; FIG. 9 is a flow chart of a third exemplary embodiment of a fabricating method of a package module in the present disclosure. Step S10 includes placing the first thermal dissipating component 230, the power module 201 and the second thermal dissipating component 234 into the cavity 310 of the mold 300. The first thermal dissipating component 230 is fixed to the top of the mold 300, the second thermal dissipating component 234 is fixed to the bottom of the mold 300, and the power module 201 including the substrate 210 and the power semiconductor component 220 is fixed between the upper mold 302 and the lower mold 304.

In this exemplary embodiment, the upper surface of the first thermal dissipating component 230 and the lower surface of the second thermal dissipating component 234 are respectively pasted with a protective film 232, to avoid the packaging plastic overflowing to the upper surface of the first thermal dissipating component 230 or to the lower surface of the second thermal dissipating component 234 during the packaging plastic injection, and to provide a relatively flat surface to allow fixing the first thermal dissipating component 230 to the top of the cavity 310 and fixing the second thermal dissipating component 234 to the bottom of the cavity 310. Moreover, to avoid the packaging plastic overflowing the space between the fins and/or the holes of the first thermal dissipating component 230 and the second thermal dissipating component 234, an additional protective film can be used on the sidewalls of the first thermal dissipating component 230 and of the second thermal dissipating component 234. The pins 240 connect to the pads 212 at the upper surface of the substrate 210, the pins 240 are not bent yet and are sandwiched between the upper mold 302 and the lower mold 304 thereby fixing the substrate 210. The first thermal dissipating component 230 and the second thermal dissipating component 234 can be fixed to the bottom and the top of the cavity 310 in a vacuum suction manner or in a magnetic suction manner.

Next, in step S20, after the upper mold 302 and the lower mold 304 are coupled, the packaging plastic 250 is injected to the cavity 310 via the packaging plastic injection port 306 and fills the cavity 310 and the space between the first thermal dissipating component 230 and the power module 201 and the space between the second thermal dissipating component 234 and the power module 201. In this way, the packaging plastic 250 combines the first thermal dissipating component 230, the second thermal dissipating component 234 and the power module 201.

Finally, step S30 is getting the packaged power module from the mold, and removing the protective film and the excessive packaging plastic 250 on the upper surface of the first thermal dissipating component 230 and on the lower surface of the second thermal dissipating component 234. The pins 240 are bent thereby getting the package module 200, in which the upper surface of the first thermal dissipating component 230 and the lower surface of the second thermal dissipating component 234 of the package module are exposed from the packaging plastic 250.

By the aforementioned fabricating method, the first thermal dissipating component 230, the second thermal dissipating component 234, and the power module 201 can be integrally formed. By directly using the packaging plastic 250 to combine the first thermal dissipating component 230, the second thermal dissipating component 234, and the power module 201, the additional process of using the thermal conductive gel or paste to bond the first thermal dissipating component 230 and the second thermal dissipating component 234 can be omitted, while the problems due to the process of using thermal conductive gel or paste and due to the different thermal expansion coefficients between the thermal conductive gel or paste and the packaging plastic 250 are also avoided.

Figure 10:
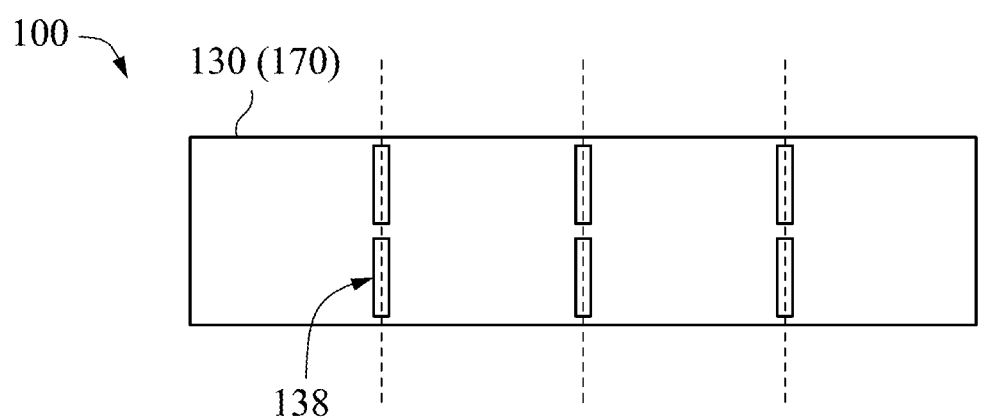
FIG. 10 is a top-view of a package module according to a sixth exemplary embodiment of the present disclosure.

Please refer to FIG. 10; FIG. 10 is a top-view of a package module according to a sixth exemplary embodiment of the present disclosure. In order to promote the production efficiency of the package module 100, the method includes producing multiple connected package modules 100 and then dividing the package modules 100 individually, such as disposing multiple electronic components on the substrate (i.e., multiple power semiconductor components and multiple electronic components) and then separating the electronic components after packaging. Since the first thermal dissipating component 130 (or the second thermal dissipating component 170) is a metal material with high hardness, it would take more time during the cutting process. Therefore, one or more slots are formed on the first thermal dissipating component 130 (and the second thermal dissipating component 170), in which the slots 138 are overlapped with the cutting path. The slots 138 can be previously produced on the first thermal dissipating component 130 (or on the second thermal dissipating component 170) by stamping or by molding. While cutting the package modules 100, the cutter will pass through the slots 138 thereby reducing the contacting area between the cutter and the metal first thermal dissipating component 130 (or the second thermal dissipating component 170). Such that the cutting efficiency can be improved and the cost of changing the cutter can be reduced.

Figure 11:
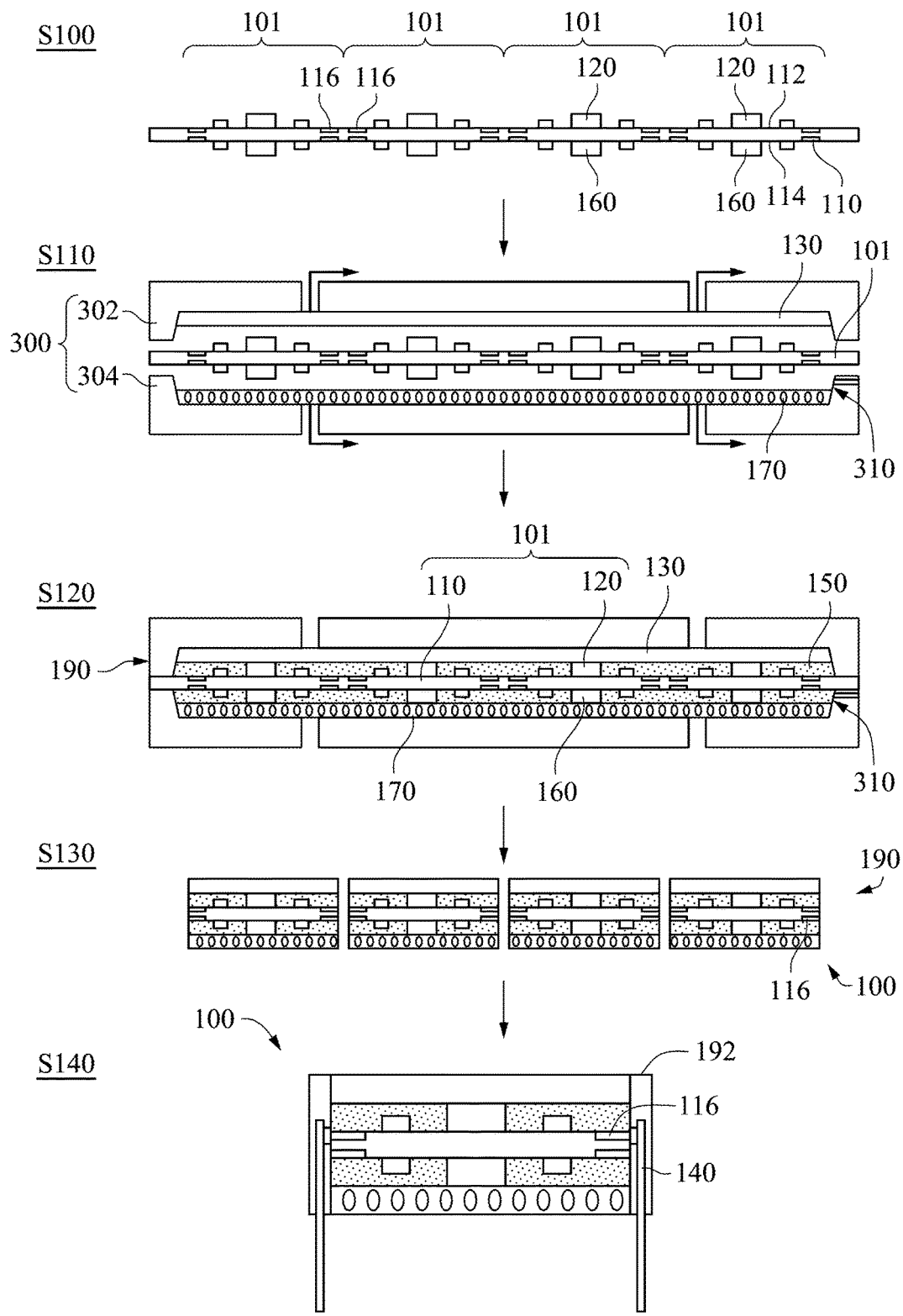
FIG. 11 is a flow chart of a fourth exemplary embodiment of a fabricating method of a package module in the present disclosure.

Please refer to FIG. 11; FIG. 11 is a flow chart of a fourth exemplary embodiment of a fabricating method of a package module in the present disclosure. Step S100 includes sequentially disposing multiple sets of power semiconductor components 120, and multiple electronic components 160 on the substrate 110 to form a plurality of power modules 101. The power semiconductor components 120 and the electronic components 160 are respectively disposed on the upper surface 112 and the lower surface 114 of the substrate 110, or the power semiconductor components 120 and the electronic components 160 can both be arranged on the upper surface 112 of the substrate 110. The power semiconductor components 120 and the electronic components 160 can be fixed to the substrate 110 by a reflow soldering process. There are spaces between each set of power semiconductor components 120 and electronic components 160, in which the pads 116 on the substrate 110 are arranged at the place of the spaces, between each set of the pads 116 are the place for the cutting paths.

Next, step S110 includes disposing the power module 101, the first thermal dissipating component 130, and the second thermal dissipating component 170 in the mold 300. The mold 300 includes the upper mold 302, the lower mold 304, and the cavity defined by the upper mold 302 and the lower mold 304. The substrate 110 is sandwiched between the upper mold 302 and the lower mold 304, in which the first thermal dissipating component 130 and the second thermal dissipating component 170 are respectively fixed to the top and bottom of the cavity 310 by the vacuum suction manner or by the magnetic suction manner.

Next, step S120 includes injecting the packaging plastic 150 to the cavity 310. The packaging plastic 150 fills the cavity 310, the space between the first thermal dissipating component 130 and the power module 101, and the space between the second thermal dissipating component 170 and the power module 101. The packaging plastic 150 covers the power module 101, the first thermal dissipating component 130 and the second thermal dissipating component 170. After the packaging plastic 150 is solidified, the package 190 is formed.

Next, step S130 includes tearing the protective film on the surface of the first thermal dissipating component 130 and the second thermal dissipating component 170, and cutting the package 190 for getting the package 190 from the mold. As shown in FIG. 10, on the first thermal dissipating component 130 and the second thermal dissipating component 170 are the slots 138 which are formed in advance, while the package 190 is cut, the cutting path will pass through the slots 138 to promote the cutting efficiency and reduce the cost of changing the cutter. After cutting the package 190, a plurality of package modules 100 are obtained. At this time the pads 116 will be exposed from the side surface of the package module 100.

Finally, step S140 includes using the solder to fix the pins 140 to the pads 116 which are exposed from the side surface of the package module 100 after the package modules 100 are separated. An insulating material 192 can be disposed on the package module 100 for protecting the pins 140. The insulating material 192 covers the locations where the pins 140 connect to the pads 116, in which a portion of the pins 140 is still exposed from the insulating material 192 to allow the package module 100 connecting to the external circuits.

The aforementioned exemplary embodiments disclose the variations and the fabricating method of the package module. On practice, for achieving better arrangement, multiple package modules 100 are stacked, the following descriptions will disclose the details.

Figure 12:
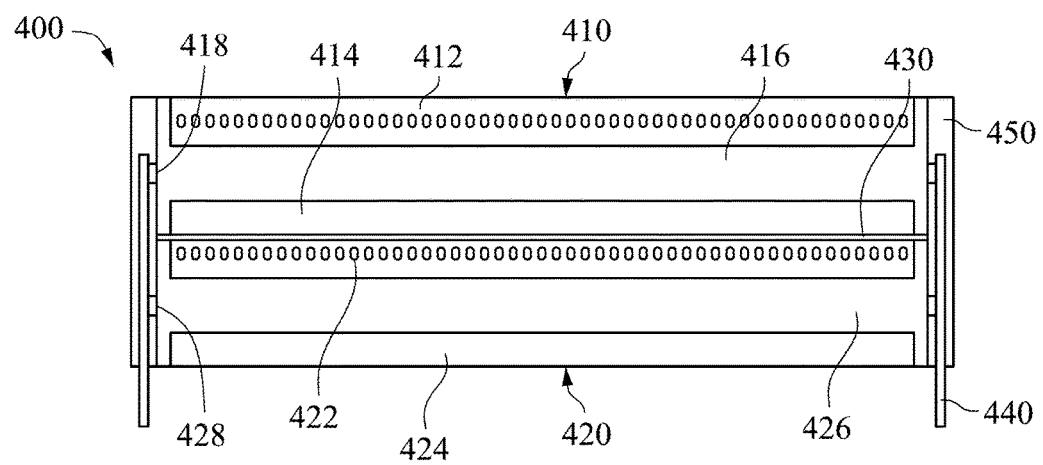
FIG. 12 is a side-view of a stack structure of a package module according to a first exemplary embodiment of the present disclosure.

Please refer to FIG. 12; FIG. 12 is a side-view of a stack structure of a package module according to a first exemplary embodiment of the present disclosure. The package module stacking structure 400 includes a first package module 410, a second package module 420, and a junction layer 430 which connects the first package module 410 and the second package module 420. In this exemplary embodiment, the details of the first package module 410 and the second package module 420 can be understood by referring to the package module 110 discussed in step S130 in FIG. 11, each of the first package module 410 and the second package module 420 includes a substrate, a power semiconductor component and an electronic component respectively disposed on the two opposite surfaces of the substrate, the first thermal dissipating components 412, 422 and the second thermal dissipating components 414, 424 respectively disposed at two opposite sides of the power semiconductor component and the electronic component, and the packaging plastics 416 and 426 used for covering the substrate and the components on the substrate. The upper surfaces of the first thermal dissipating components 412 and 422, and the lower upper surfaces of the second thermal dissipating components 414 and 424 are exposed from the packaging plastics 416 and 426. The first package module 410 and the second package module 420 can have structures substantially the same or their structures can be different.

The sidewalls of the first package module 410 are arranged with a plurality of first pads 418, and the sidewalls of the second package module 420 are arranged with a plurality of second pads 428. The first pads 418 are exposed from the first package module 410, and the second pads 428 are exposed from sidewalls of the second package module 420. The package module stacking structure 400 includes a plurality of pins 440. The pins 440 respectively connect to the corresponding first pads 418 and/or the second pads 428. As disposed in the exemplary embodiment, at least a portion of the pins 440 connect to the first pads 418 and the second pads 428 at the same time.

The package module stacking structure 400 further includes an insulating material 450. The insulating material 450 covers the peripheries of the first package module 410 and of the second package module 420 while a portion of the pins 440 is exposed from the insulating material 450. The insulating material 450 can be used for protecting the connections between the first pads 418 and the pins 440 and between the second pads 428 and the pins 440, for avoiding the short circuit of the pins 440.

Figure 13:
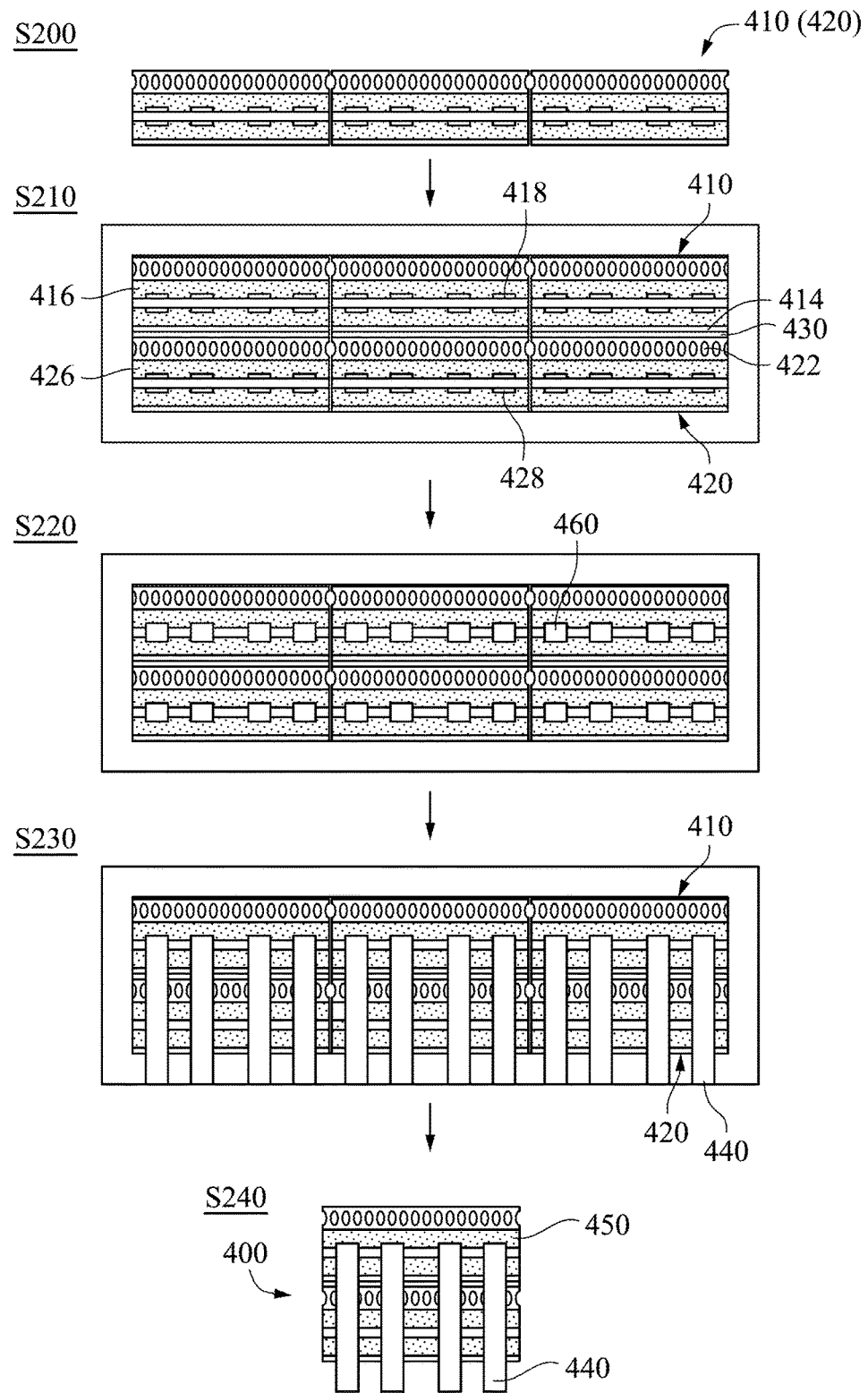
FIG. 13 is a flow chart of a fabricating method of a package module stacking structure according to an exemplary embodiment of the present disclosure.

Please refer to FIG. 13; FIG. 13 is a flow chart of a fabricating method of a package module stacking structure according to an exemplary embodiment of the present disclosure. Step S200 is providing a plurality of divided package module 410(420), the fabricating method of the package module 410(420) can refer to steps S110 to S130 in FIG. 11.

Step S210 includes using a jig for stacking a plurality of package module 410(420). At this time, the package module at the upper layer can be viewed as the first package module 410, and the package module at the lower layer can be viewed as the second package module 420. The junction layer 430 between the first package module 410 and the second package module 420 can be made by solder. More particularly, the junction layer 430 bonds the second thermal dissipating component 414 of the first package module 410 and the first thermal dissipating component 422 of the second package module 420. The first pads 418 are exposed from the side surface of the packaging plastic 416 and the second pads 428 are exposed from the side surface of the packaging plastic 426.

Step S220 includes disposing the solder 460 on the exposed pad. The solder 460 can be disposed on the pad by printing, dispensing, or by electroplating.

Step S230 includes mounting the pins 440 on the side surfaces of the first package module 410 and of the second package module 420, in which the pins 440 respectively connect to the corresponding pads. Next, the jig and the first package module 410, the second package module 420, and the pins 440 within the jig are sent into the reflow oven, for making the first package module 410, the second package module 420 and the pins 440 in close contact.

Finally, step S240 includes removing the package module stacking structure 400 from the jig, and then using the dispensing manner or the coating manner to cover the insulating material 450 on the side surfaces of the first package module 410 and of the second package module 420, for protecting the connections between the pins 440 and the pads. A portion of the pins 440 is exposed from the insulating material 450, for allowing the package module stacking structure 400 connecting to the external circuits by the pins 440.

Figure 14:
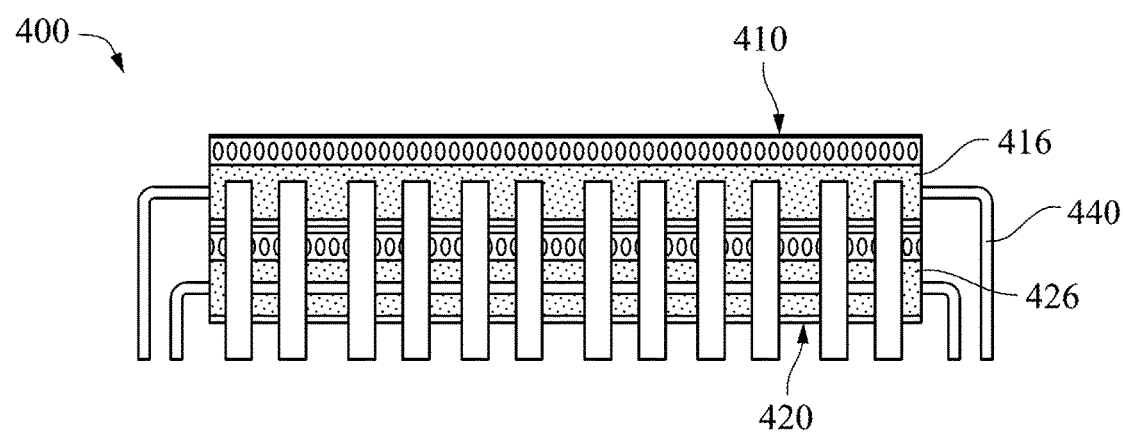
FIG. 14 is a side-view of a stack structure of a package module according to a second exemplary embodiment of the present disclosure.

Please refer to FIG. 14; FIG. 14 is a side-view of a stack structure of a package module according to a second exemplary embodiment of the present disclosure. In this exemplary embodiment, the first package module 410 and the second package module 420 are made according to the fabricating method disclosed in FIG. 9, that is, the pads of the first package module 410 and of the second package module 420 are disposed on the upper surface of the substrate, while the pins 440 are soldered on the pads before injecting the packaging plastics 416 and 426, after the packaging plastics 416 and 426 are solidified, the first package module 410 and the second package module 420 are formed. Next, a solder is utilized to connect the first package module 410 and the second package module 420, and then the pins 440 are bent. In this way, different from the former exemplary embodiment, the pins 440 in this exemplary embodiment only connect to the corresponding first package module 410 or second package module 420, herein the pins 440 would not connect to both the first package module 410 and the second package module 420 at the same time.

The package module discussed in the present disclosure directly uses the packaging plastic to connect the substrate and the thermal dissipating component, which the usage of the thermal conductive gel or paste is omit, in this way, the conventional problems due to the different thermal expansion coefficients between the thermal conductive gel or paste and the packaging plastic are avoided.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A package module, comprising:
a power module, comprising:
a substrate; and
at least one power semiconductor component disposed on the substrate;
a first thermal dissipating component disposed over the power module;
a packaging plastic covering the power module and the first thermal dissipating component, wherein the first thermal dissipating component and the power module are connected only by the packaging plastic, and a portion of the first thermal dissipating component exposed from the packaging plastic, and
a second thermal dissipating component disposed under the power module, wherein the packaging plastic covers the second thermal dissipating component, and a portion of the second thermal dissipating component is exposed from the packaging plastic.

2. The package module of claim 1, wherein the first thermal dissipating component or the second thermal dissipating component is a heat sink, a combination of the heat sink and a set of fins, a set of fins, or a heat sink with a plurality of holes.

3. The package module of claim 2, further comprising a passive component disposed on an upper surface of the first thermal dissipating component or a lower surface of the second thermal dissipating component.

4. The package module of claim 3, wherein the passive component is an inductor, a transformer, or a capacitor.

5. The package module of claim 1, wherein a lower surface of the second thermal dissipating component is exposed from the packaging plastic or an upper surface of the first thermal dissipating component is exposed from the packaging plastic.

6. The package module of claim 1, wherein the first thermal dissipating component is a heat sink, and the heat sink has a flange, the flange is embedded in the packaging plastic.

7. The package module of claim 1, wherein the first thermal dissipating component is a heat sink, the heat sink has at least one lug, the lug is disposed over the power semiconductor component, and is embedded in the packaging plastic.

8. A package module stacking structure, comprising a first package module, a second package module, and a junction layer connecting the first package module to the second package module, wherein each of the first package module and the second package module comprises a power module, a first thermal dissipating component, and a packaging plastic for covering the power module and the first thermal dissipating component, wherein the first thermal dissipating component and the power module are connected only by the packaging plastic, wherein the power module comprises a substrate, and at least one power semiconductor component disposed on the substrate, wherein a portion of the first thermal dissipating component is exposed from the packaging plastic.

9. The package module stacking structure of claim 8, wherein each of the first package module and the second package module further comprises:
a second thermal dissipating component disposed under the power module, wherein the packaging plastic covers the second thermal dissipating component, and a portion of the second thermal dissipating component is exposed from the packaging plastic.

10. The package module stacking structure of claim 9, wherein the first thermal dissipating component or the second thermal dissipating component is a heat sink, a combination of the heat sink and a set of fins, a set of fins, or a heat sink with a plurality of holes.

11. The package module stacking structure of claim 8, further comprising a plurality of pins, wherein a sidewall of the first package module comprises a plurality of first pads, the sidewall of the second package module comprises a plurality of second pads, wherein the pins connect the first pads and the second pads.

12. The package module stacking structure of claim 11, further comprising an insulating material covering peripheries of the first package module and of the second package module, wherein a portion of the pins is exposed from the insulating material.

13. A method for fabricating a package module, comprising:
forming a plurality of slots on a first thermal dissipating component;

disposing at least a power semiconductor component on a substrate sequentially, to form a plurality of power modules;

disposing the power modules in a cavity of a mold, wherein the mold comprises an upper mold and a lower mold, and the substrate is sandwiched between the upper mold and the lower mold and in contact with the upper mold and the lower mold;

disposing the first thermal dissipating component in the cavity, wherein the first thermal dissipating component is fixed to a top of the cavity and in contact with the upper mold;

injecting a packaging plastic in the cavity for covering the power modules and the first thermal dissipating component thereby forming a package;

getting the package from the mold; and cutting the package along the slots, for getting a plurality of the package modules.

14. The method of claim 13, further comprising:

welding a plurality of pins to a plurality of pads exposed from side surfaces of the package modules.

15. The method of claim 13, wherein the first thermal dissipating component is fixed to the top of the cavity in a vacuum suction manner.

16. The method of claim 13, wherein the first thermal dissipating component is fixed to the top of the cavity in a magnetic suction manner.

17. The method of claim 13, further comprising:

pasting a protective film on an upper surface of the first thermal dissipating component.

* * * * *